(12) United States Patent
Frayssinet et al.

(10) Patent No.: US 7,118,929 B2
(45) Date of Patent: Oct. 10, 2006

(54) PROCESS FOR PRODUCING AN EPITAXIAL LAYER OF GALLIUM NITRIDE

(75) Inventors: Eric Frayssinet, Mougins (FR); Bernard Beaumont, Valbonne (FR); Jean-Pierre Faurie, Valbonne (FR); Pierre Gibart, Chatearneuf (FR)

(73) Assignee: Lumilog, Vallauris (FR)

( * ) Notice: Subject to any disclaimer, the term of this patent is extended or adjusted under 35 U.S.C. 154(b) by 0 days.

(21) Appl. No.: 10/695,724

(22) Filed: Oct. 28, 2003

(65) Prior Publication Data

US 2004/0137732 A1 Jul. 15, 2004

Related U.S. Application Data

(63) Continuation-in-part of application No. 09/960,829, filed on Sep. 21, 2001, now Pat. No. 6,802,902, which is a continuation of application No. 09/530,050, filed on Jul. 7, 2000, now Pat. No. 6,325,850.

(51) Int. Cl.
 *H01L 21/00* (2006.01)
 *H01L 21/28* (2006.01)

(52) U.S. Cl. .................... 438/22; 438/41; 438/604; 438/606

(58) Field of Classification Search ............ 438/22, 438/41, 604, 606; 117/95, 96; 119/97
See application file for complete search history.

(56) References Cited

U.S. PATENT DOCUMENTS

| | | | |
|---|---|---|---|
| 6,319,742 B1 * | 11/2001 | Hayashi et al. | 438/46 |
| 6,440,823 B1 * | 8/2002 | Vaudo et al. | 438/478 |
| 6,475,882 B1 | 11/2002 | Sakai et al. | |
| 6,794,276 B1 * | 9/2004 | Letertre et al. | 438/506 |
| 6,852,161 B1 * | 2/2005 | Urashima et al. | 117/104 |
| 2002/0048964 A1 * | 4/2002 | Yuasa et al. | 438/763 |

FOREIGN PATENT DOCUMENTS

FR 0506146 A2 4/1981
WO PCT/FR 03/02340 7/2003

OTHER PUBLICATIONS

"Selective area epitaxy of GaN for electron field emission devices", D. Kapolnek, et al., Journal of Crystal Growth 170 (1997) pp. 340-343.
"Selective growth of wirtzite GaN and $Al_xGa_{1-x}N$ on GaN/sapphire substrates by metalorganic vapor phase epitaxy", Y. Kato, et al., Journal of Crystal Grown 144 (1994) 133-140.

(Continued)

*Primary Examiner*—Hsien-Ming Lee
(74) *Attorney, Agent, or Firm*—Blakely Sokoloff Taylor & Zafman

(57) ABSTRACT

The present invention relates to a process for producing an epitaxial layer of gallium nitride (GaN) as well as to the epitaxial layers of gallium nitride (GaN) which can be obtained by said process. Such a process makes it possible to obtain gallium nitride layers of excellent quality by (i) forming on a surface of a substrate, a film of a silicon nitride of between 5 to 20 monolayers, functioning as a micromask, (ii) depositing a continuous gallium nitride layer on the silicon nitride film at a temperature ranging from 400 to 600° C., (iii) after depositing the gallium nitride layer, annealing the gallium nitride layer at a temperature ranging from 950 to 1120° C. and (iv) performing an epitaxial regrowth with gallium nitride at the end of a spontaneous in situ formation of islands of gallium nitride.

10 Claims, 6 Drawing Sheets

OTHER PUBLICATIONS

"The effect of the Si/N treatment of a nitridated sapphire surface on the growth mode of GaN in low-pressure metalorganic vapor phase epitaxy", S. Haffouz, et al., 1998 American Institute of Physics, vol. 73, No. 9, Aug. 31, 1998, p. 1278-1280.

"Influence of in sity sapphire surface preparation and carrier gas on the growth mode of GaN in MOVPE", P. Vennegues, et al., Journal of Crystal Growth, pp. 167-177.

"Effect of Magnesium and Silicon on the lateral overgrowth of GaN patterned substrates by Metal Organic Vapor Phase Epitaxy", S. Haffouz, et al., MRS Internet Journal Nitride Semiconductor Research, p. 1-6.

"Growth of high-quality GaN by low-pressure metal-organic vapour phase epitaxy (LP-MOVPE) from 3D islands and lateral overgrowth", H. Lahreche, et al., Journal of Crystal Growth, pp. 245-252.

"Anti-Surfactant in III-Nitride Epitaxy-Quantum Dot Formation and Dislocation Termination-", S. Tanaka, et al, Appl. vol. 39 (2000) pp. L831-L834.

"Growth Morphology and the Equilibrium Shape: The Role of "Surfactants" in Ge/Si Island Foundation", D. Eaglesham, et al., Physical Review Letters, vol. 70, No. 7, pp. 996-968.

"Reduction mechanisms for defect densities in GaN using one-or two-step epitaxial lateral overgrowth methods", P. Vennegues, et al., Journal of Applied Physics, vol. 87, No. 9.

"The effect of H2 on morphology evolution during GaN metalorganic chemical vapor deposition", J. Han, et al., Appl. Phys. Lett. 71, Nov. 24, 1997, pp. 3114-3116.

"Optimization of Si/N Treatment Time of Sapphire Surface and Its Effect on the MOVPE GaN Overlays", S. Haffouz, et al., pp. 677-681.

"Oscillator strengths for optical band-to-band processes in GaN epilayers", B. Gil, Physical Review B, vol, 54, No. 11, 1996 The American Physical Society, pp. 7678-7681.

"High-Resolution Photoluminescence and Reflectance Spectra of Homeopitaxial GaN Layers", K. Kornitzer, et al., p. 5-9.

"Dynamics of excitonic recombination and interactions in homoepitaxial GaN", K Korona, 2002 the American Physical Society, 8 pages.

* cited by examiner (a)

(b)

(c)

(d)

PROCESS FOR PRODUCING AN EPITAXIAL LAYER OF GALLIUM NITRIDE

CROSS-REFERENCE TO RELATED APPLICATIONS

The application is a continuation-in-part of application Ser. No. 09/960,829, filed Sep. 21, 2001 now U.S. Pat. No. 6,802,902, which is a continuation of application Ser. No. 09/530,050, filed Jul. 7, 2000 now U.S. Pat. No. 6,325,850.

The present invention relates to a process for producing an epitaxial layer of gallium nitride (GaN) as well as to the epitaxial layers of gallium nitride (GaN) which can be obtained by said process. Such a process makes it possible to obtain gallium nitride layers of excellent quality.

It also relates to the short-wavelength optical devices or the high-power high-frequency electronic devices provided with such epitaxial gallium nitride layers.

It relates in particular to optoelectronic components formed on such gallium nitride layers.

The lasing effect (by optical pumping) on GaN has been known for a long time. Although laser diodes based on III–V nitride grown on G aN/sapphire have been produced, the crystal quality of the nitride layers constituting the structure of these laser diodes is poor. Dislocation densities ranging from $10^9$ to $10^{10}$ cm$^{-2}$ have been measured on these layers.

In fact, the defects associated with the formation of relatively thick epitaxially grown GaN layers indicated above have considerably slowed down the development of laser diodes provided with such layers: high residual n, absence of single crystals and of suitable substrates, impossibility of producing p-doping.

The publication by D. Kalponek et al., "Journal of Crystal Growth," 170 (1997) 340–343, mentions the localized nitride growth in apertures formed in a mask so as to form pyramidal structures.

The publication by Y. Kato, S. Kitamura, K. Hiramatsu and N. Sawaki, "J. Cryst Growth," 144, 133 (1994), describes the selective growth of gallium nitride by MOVPE on sapphire substrates on which has been deposited a thin gallium nitride layer masked by an SiO$_2$ layer etched so as to reveal continuous bands of gallium nitride.

The document EP 0506146 describes a process for local and lateral growth using a mask, shaped by lithography, to localize the growth. The examples of smooth layers relate in no case to gallium nitride. These examples mention GaAs homoepitaxy on a GaAs substrate and InP homoepitaxy on an InP substrate.

The III–V compound semiconductor family has proven high performance in high-speed electronics, optical emitters, i.e., Laser Diodes (LDs), Light Emitting Diodes (LEDs), and detectors. However, for efficient operation, high crystalline quality is required. Growth technologies for large-scale substrates are currently greatly advanced for Si and to a lesser extend for GaAs, even lesser for InP and other III–V substrates. For GaN, bulk crystals are not readily available. Bulk GaN is intrinsically very difficult to grow because of the high vapor pressure of nitrogen at the melting point of GaN.

Since there is no GaN bulk single crystal available, the entire technological development of GaN based devices relies on heteroepitaxy. GaN is currently grown epitaxially by Metal Organics Vapour Phase Epitaxy (MOVPE), Halide Vapor Phase Epitaxy (HVPE) and Molecular Beam Epitaxy (MBE). Most of the current device structures are grown on sapphire or 6H—SiC. Potentially more appropriate substrates like LiAlO$_2$, MgAl$_2$O$_4$, ScMgAlO$_4$, ZnO, ZrB$_2$ and Hf have been tested in several laboratories. Even though good quality GaN epilayers were obtained, none were significantly better than GaN/sapphire layers. Therefore, the use of alternative substrates has not yet solved the problem of obtaining a suitable substrate.

The lattice parameters and the thermal expansion coefficients of sapphire and SiC are not well matched to GaN. Thus, the epitaxial growth of GaN on these substrates generates huge densities of dislocations ($10^9$ to $10^{10}$ cm$^{-2}$). These dislocations propagating up to the surface have an adverse effect on the performance of optical and electronic devices. Using appropriate nucleation layers reduces the dislocations density down to the mid $10^8$ cm$^{-2}$ ranges. LDs have been demonstrated in the late nineties with such defective layers. The real breakthrough in the laser technology has been however the dramatic improvement of the laser diode lifetime at the end of 1997 which has reached up to 10000 hours. This has been made possible with the implementation of the Epitaxial Lateral Overgrowth (ELO) technology, which significantly reduces the dislocations density [P. Vennéguès, B. Beaumont, V. Bousquet, M. Vaille, P. Gibart, J. Appl. Phys, 87, 4175 (2000)]. Even though ELO technology leads to an outstanding increase of the lifetimes of LDs, the ELO structure with its array of coalescence boundaries makes LD technology difficult. Besides, ELO technology involves ex situ photolithographic steps that are time consuming and relatively expensive. It would be of great interest to keep the advantages of ELO without the requirement of making a mask on a GaN epitaxial layer by photolithography.

In previous papers [S. Haffouz, H. Lahrèche, P. Vennéguès, B. Beaumont, F. Omnès and P. Gibart, Appl. Phys. Lett. 73, 1278 (1998); P. Vennéguès, B. Beaumont, S. Haffouz, M. Vaille and P. Gibart, J. Cryst. Growth, 187, 167 (1998); S. Haffouz, B. Beaumont and Pierre Gibart, MRS Internet LJ. Nitride Semicond. Res.3, 8 (1998); H. Larèche, P. Vennéguès, B. Beaumont, P. Gibart, J. Cryst. Growth, 205, 245–252(1999); S. Haffouz, B. Beaumont, P. Vennéguès and P. Gibart, Phys. Stat. Sol., (a)176, 677 (1999);] it has been shown that the treatment of the sapphire substrate by a mixture of silane and ammonia (hereafter called Si/N treatment) induces a three dimensional growth mode at the first stage of the epitaxy of GaN, thus reducing the dislocation density down to the mid $10^8$ cm$^{-2}$ range. More specifically, it has been shown that SiN acts like an in situ micro-mask in this process [S. Tanaka, M. Takeuchi and Y. Aoyagi, Jpn. J. Appl. Phys, 39, L831(2000)]. In-depth characterization has proven that indeed the Si/N treatment can lead to a non-uniform coverage of the sapphire surface by amorphous SiN islands thus functioning as a micro-mask during subsequent GaN growth.

This approach has been significantly improved in the present invention and currently led to threading dislocations density, (TD density) below $10^8$ cm$^{-2}$.

Thus, the object of the process according to the invention is to obtain crystalline layers allowing the production of optoelectronic devices (especially laser diodes and LW LEDs) having life times and performance characteristics which are superior to those obtained previously on GaN on sapphire.

The inventors have found that the treatment of a substrate by deposition of a silicon nitride layer followed by deposition of gallium nitride, which is itself followed by thermal annealing, causes the formation of gallium nitride islands which are virtually defect-free.

The coalescence of such islands caused by the heat treatment results in a gallium nitride layer of excellent quality.

In one embodiment, the invention relates to a process for producing a layer of gallium nitride (GaN), characterized in that it comprises the deposition on a substrate of a silicon nitride layer functioning as a micro-mask and the regrowth of gallium nitride on the masked substrate under epitaxial deposition conditions so as to induce the deposition of gallium nitride features and the anisotropic and lateral growth of said features, the lateral growth being continued until coalescence of the various features. The term "islands" instead of "features" may also be employed.

More particularly the invention relates to a process for producing an epitaxial layer of gallium nitride (GaN) comprising:

forming on a surface of a subtrate, a film of a silicon nitride of between 5 to 20 monolayers, functioning as a micro-mask;

depositing a continuous gallium nitride layer on the silicon nitride film at a temperature ranging from 400 to 600° C., preferably from 450 to 550° C.

after depositing the gallium nitride layer, annealing the gallium nitride layer at a temperature ranging from 950 to 1120° C., preferably from 1050 to 1080° C.;

performing an epitaxial regrowth with gallium nitride at the end of a spontaneous in situ formation of islands of gallium nitride.

The substrate generally has a thickness of a few hundred micrometers (in particular, approximately 400 micrometers) and may be chosen from the group consisting of sapphire, ZnO, 6H—SiC, 4H—SiC, 3C—SiC, LiAlO$_2$. LiGaO$_2$, MgAl$_2$O$_4$, Si, GaAs, ZrB$_2$, AlN and GaN.

The deposition of silicon nitride is carried out in the gallium nitride growth chamber from silane and ammonia.

Preferably, the carrier gas is an N$_2$/H$_2$ mixture and must anyway contain H$_2$. According to the invention, the silicon nitride layer comprises several monolayers of SiN, i.e. between 5 and 20.

The experiments and in particular Example 1 as set forth below, reveal two basic features about the role of the SiN layer. At first, the occurrence of Si at the sapphire/GaN interface produces an "antisurfactant" effect, thereby inducing a three dimension (3D) nucleation. After 3D nucleation, growth further proceeds laterally from {1–101} facets until full coalescence. This effect is used for producing GaN/sapphire with TDs densities in the mid $10^8$ cm$^{-2}$ ranges Indeed, the nature of the SiN layer depends on its thickness. For thickness of the order of one monolayer, as already claimed in U.S. application Ser. No. 09/960,829, SiN continuously wets the sapphire substrate whereas for the equivalent of several monolayers (about 10) like in the present invention, SiN exhibits nano holes with random size. For even thicker SiN layer, a continuous layer is obtained, which can be used as a mask. Epitaxial gallium nitride layers obtained by the process according to the invention typically show TDs densities ranging from $2.10^7$ to $1.10^8$ cm$^{-2}$.

In the framework of the present invention, after annealing the low temperature GaN buffer layer on the SiN layer deposited during typically 360 sec, a coherent array of pyramids with different sizes are produced (FIGS. 1b and 8a). Epitaxial regrowth on the substrate is carried out using MOVPE. Regular features or islands develop. Examination in a high-resolution electron microscope shows that the GaN dislocation density in the regular features or islands, which has therefore grown without heteroepitaxial strains, is very much less than that produced by the direct deposition of gallium nitride on the substrate. Thus, the GaN growth, which takes place laterally in the [10$\bar{1}$0] directions on a silicon nitride surface, results in much better GaN crystal quality than the usual processes. After said features have been obtained, the growth may be continued, either using MOVPE or HVPE. Growth takes place laterally, until coalescence of the islands. These surfaces resulting from the coalescence of islands exhibit crystal quality superior to the layers grown heteroepitaxially on sapphire.

Actually the ELO mechanism taking place corresponds to a new modification of the ELO technology where coalescence arises from pyramids with different sizes. Such a process has been studied in the case of stripes openings along [1–100] GaN directions with different widths (FIG. 8c). This technology is refereed as ALFAGEO for Asymmetric Lateral Facets Grown Epitaxial Overgrowth described in the non published PCT Patent application PCT/FR03/02340. FIG. 8 shows the TEM image of such an ELO structure made from asymmetric openings. The ELO starts as usual by the formation of triangular stripes with {11–22} facets. Inside these stripes most of the TDs bend at 90° when they meet the {11–22} facets. A straightforward explanation of the 90° bending could be the following: qualitatively, from simple free energy minimization viewpoint, the dislocation behavior in the presence of a free surface can be analysed as follows: the Burgers vector of the threading dislocations (TDs) is not normal to the surface, this causes a straight dislocation line to feel forces tending to orient it at a certain angle to the normal. These forces acting on such a line are the sum of two terms, one acts to rotate the line so that it is normal to the surface, while the second term acts to align the dislocation with the Burgers vector. During growth, dislocations follow a direction leading to minimum enthalpy. As the line energy of a dislocation depends also of its character, the energy of a screw being the lowest, bending at 90° of a edge dislocation eventually produce a screw dislocation, or introduce a screw component thus lowering the enthalpy of the system. After bending, most of TDs run parallel to the growing interface where they create a coalescence boundary with the overgrowth coming from the adjacent stripe. This boundary is an area of defects accumulation. In FIG. 8, the dislocation labelled 1 and 2, after bending first at 90° inside the smallest triangular stripe, bend again upwards. In standard ELO, these TDs merge at the surface where they create a line of defects as explained in P. Vennéguès, B. Beaumont, V. Bousquet, M. Vaille, P. Gibart, J. Appl. Phys, 87, 4175 (2000). In the ALFAGEO technology, because of the particular coalescence process which is schematically drawn FIG. 9, the TDs met a second time a {11–22} facets (coming from the largest triangular stripe) and therefore underwent a third 90° bending. This multiple bending is linked to the intrinsic mechanisms in ALFAGEO. Such a multiple bending is shown on FIG. 4 (right part). This ALFAGEO mechanism takes places when any asymmetry is introduced, either purposely by the design of masks, or spontaneously like in the Si/N treatment of the sapphire surface.

The process according to the invention is noteworthy in that it limits the density of defects generated by the parameter mismatch between GaN and the substrate using a method which combines localized epitaxy, growth anisotropy and lateral growth, thereby limiting the epitaxial strains.

To sum up, the improvement of the Si/N treatment process according to the present invention consisting in depositing several monolayers of SiN, i.e. between 5 and 20, instead of a monolayer as in U.S. patent application Ser. No. 09/960, 829, allows providing GaN/sapphire templates with TDs densities as low as $7\times10^7$ cm$^{-2}$ measured by AFM and cathodoluminescence (CL). Full Width at Half Minimum (FWHM) of the near band gap PL recombination peak is lower than 2 meV. Time-resolved photoluminescence experiments show that the lifetime of the A free exciton is principally limited by capture onto residual donors, similar to the situation for nearly dislocation-free homoepitaxial layers. Such a treatment induces a modification of the ELO technologies, the ALFAGEO process, which produces multiple bending of the TDs, thereby reducing their densities more efficiently than in standard ELO processes.

The novelty of the process therefore consists in using the growth anisotropy to induce lateral growth, going as far as coalescence, and thus in obtaining a continuous GaN layer. The lateral growth takes place from gallium nitride islands having reduced defect densities, said features being obtained by localized epitaxy.

According to a variant, the epitaxial regrowth is carried out using undoped gallium nitride.

According to another variant, the epitaxial regrowth is carried out using gallium nitride doped with a dopant chosen from the group consisting of magnesium, zinc, cadmium, beryllium, calcium, silicium, oxygen, tin, germanium, and carbon, especially with magnesium. This is because it has been found that the doping of gallium nitride with a doping agent, especially magnesium, modified the GaN growth mode and resulted in a relative increase in the growth rate in the <10$\bar{1}$1> directions with respect to the growth rate in the [0001] direction. Preferably, the dopant/Ga molar ratio is greater than 0 and less than or equal to 1, advantageously less than 0.2.

The invention also relates to the epitaxially grown gallium nitride layers, characterized in that they can be obtained by the above process. Advantageously, these layers have a defect density of less than those obtained in the prior art, especially less than approximately $10^8$ cm$^{-2}$.

Preferably, the epitaxial layer has a thickness of between 1 and 1000 micrometers and optionally in that it is self-supported after the substrate has been separated.

The invention finds particularly advantageous application in the production of laser diodes and UV LEDs provided with an epitaxial gallium nitride layer described above.

The invention finally relates to a thick (100 μm to 1 cm) GaN layer obtained by either HVPE or sublimation on a crystalline substrate which can be obtained by the process according to the present invention, but also to a free standing GaN layer obtained after separating from the starting substrate (ZnO, 6H—SiC, 4H—SiC, 3C—SiC, LiAlO$_2$, LiGaO$_2$, MgAlO$_4$, Si, GaAs, AlN, ZrB$_2$ and GaN) of said thick layer and to an optoelectronic component, provided with said free standing gallium nitride layer.

BRIEF DESCRIPTION OF THE DRAWINGS

Features, aspects, and advantages of embodiments will become more thoroughly apparent from the following detailed description, appended claims, and accompanying drawings in which:

EXAMPLE 1

Spontaneous Formation of Gallium Nitride Islands on a Silicon Nitride Layer of the Order of an Atomic Monolayer/Comparison Example This example illustrates a method making it possible to obtain spontaneous formation of gallium nitride islands on a substrate by a treatment consisting in covering the substrate with a silicon nitride film whose thickness is of the order of 1 angström. Advantageously, this method makes it possible to avoid having to use ex situ etching of the mask by expensive techniques such as photolithography and chemical etching.

A suitable epitaxial growth reactor is used for the metalorganic vapor phase epitaxy. Explicitly, a substrate, especially (0001) sapphire, is heated to a temperature of approximately 1050–1080° C. in order to be nitrided by exposure to a stream of NH$_3$ for approximately 10 minutes. After this nitriding step, a very thin film of silicon nitride is formed on the surface of the substrate, the film being obtained by reaction between NH$_3$ and silane SiH$_4$ at a temperature of 1080° C. for a time short enough to limit the thickness of the film to that of one atomic plane.

The operating conditions are the following:

The gaseous vehicle is a mixture of nitrogen and hydrogen in equal proportions (4 sl/min.). The ammonia is introduced with a flow rate of 2 sl/min. while the silane, in a form diluted to 50 ppm in hydrogen, is introduced with a flow rate of 50 scc/min. Under these conditions, the typical NH$_3$ and SiH$_4$ reaction time is of the order of 30 seconds.

The successive steps are monitored by laser reflectometry (LR) and transmission electron microscopy (TEM).

After the silicon nitride layer has been completely formed, a continuous gallium nitride layer having a thickness of 20 to 30 nm is deposited on the silicon nitridebetween 450 and 550° C.

Figure 1:
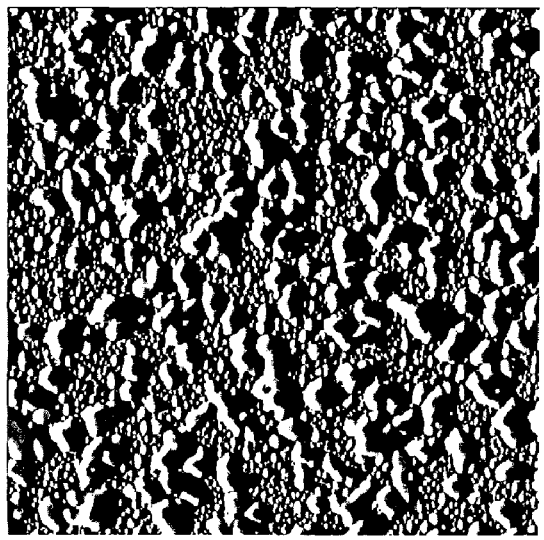
FIG. 1 shows AFM (5×5 μm$^2$) scans showing the layer morphology versus SiN treatment time. The GaN islands density is about a) $1\times10^9$ cm$^{-2}$ b) $5\times10^8$ cm$^{-2}$ c) $3\times10^8$ cm$^{-2}$ d) $1\times10^8$ cm$^{-2}$.
Figure 1:
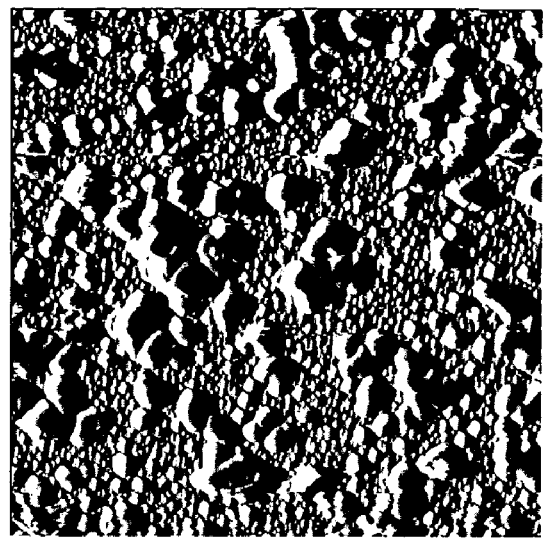
Figure 1:
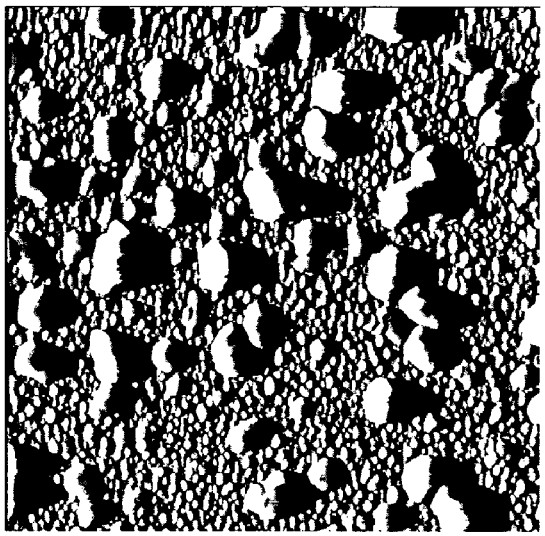
Figure 1:
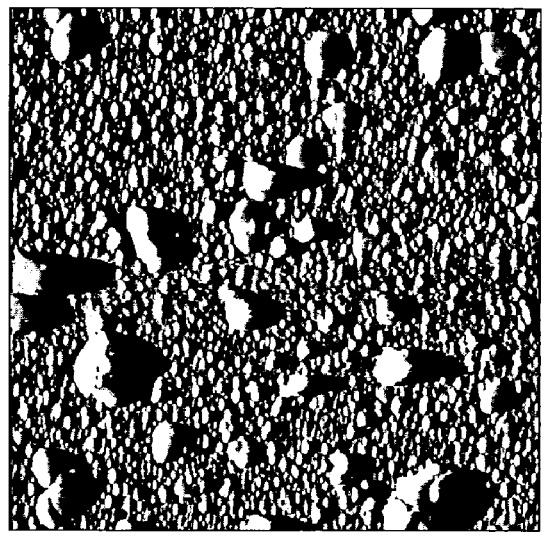
Figure 2:
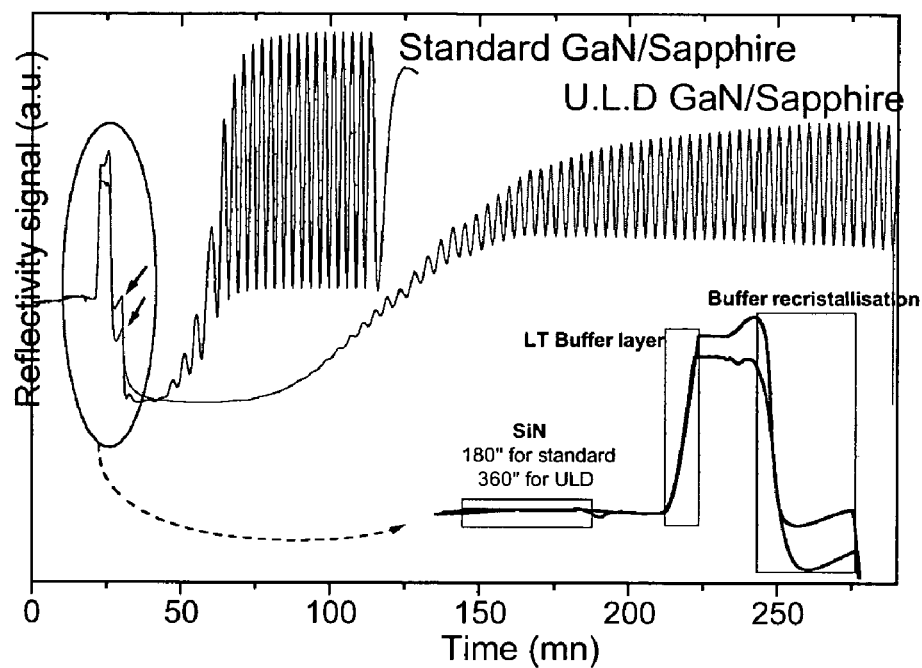
FIG. 2 shows a comparison between reflectivity spectra recorded during the growth of GaN/sapphire standard epilayer and Ultra Low Dislocation (ULD) GaN/sapphire. Arrows indicate where the growth starts.

After the deposition of the GaN layer has been completed, it is annealed at a high temperature of the order of 1080° C. Under the combined effect of the temperature rise, of the presence in the gaseous vehicle of a sufficient amount of hydrogen and of the presence of the very thin silicon nitride beneath the GaN layer, the morphology of said GaN layer undergoes deep modification resulting from solid-phase recrystallization by mass transport. (FIG. 1a). When the temperature approaches 1060° C., it should be noted that the reflectivity of the buffer layer suddenly decreases (FIG. 2, curve standard GaN/sapphire). The initially continuous buffer layer is then converted into a discontinuous layer formed from gallium nitride islands.

At the end of this spontaneous in situ recrystallization process, GaN features or islands of very good crystal quality are obtained, these retaining an epitaxial relationship with the substrate by virtue of the very small thickness of the silicon nitride layer. The GaN features or islands are isolated from one another by regions or the silicon nitride layer is bared. The characteristic heights of the islands are of the order of 240 nm. The observation obtained with a transmission electron microscope shows that the islands tend to take the shape of truncated pyramids.

Figure 9:
FIG. 9 shows a scanning electron microscope image of the pyramids obtained during growth according to example 1 (comparison example).

FIG. 9 is a scanning electron microscope image of a specimen obtained under operating conditions that are modified so as to increase the dimensions of the islands of micrometric values comparable to those of the islands or features obtained in the apertures of a mask produced ex situ by photolithography.

During the subsequent epitaxial regrowth with gallium nitride on the surface of a specimen, those regions of the silicon nitride that are bare will function as a mask. Explicitly, the GaN features or islands will develop by lateral and vertical growth.

GaN layers have thus been obtained by coalescence of the GaN features having a defect density of the order of $10^8$ cm$^{-2}$, i.e., two orders of magnitude less than that of the defects present in the gallium nitride layers produced using the conventional methods.

Thus, the use of the ex situ process of etching the apertures in a mask may advantageously be avoided and replaced with the in situ spontaneous formation, described above, of the GaN islands or features, the control of their geometry and dispersion not being a prerequisite for improving the quality of the GaN layers formed by this process.

It has been observed that two parameters are of critical importance to induce the 3D growth process: (1) the composition of the carrier gas (N$_2$ or N$_2$+H$_2$) and (2) the duration of the Si/N treatment. The GaN island formation is achievable only when H$_2$ is present in the carrier gas. H$_2$ seems to act as a "morphactant" as explained in D. J. Eagleasham, F. C. Unterwald and D. C. Jacobson, Phys. Rev. Lett. 70, 966 (1993) that called impurities which favor particular equilibrium shapes of islands. Recent studies, namely J. Han, T.-B. Ng, R. M. Biefeld, M. H. Crawford and D. M. Follstaedt, Appl. Phys. Lett. 71,3114 (1997), have also reported that the appearance of islands is strongly related to the H$_2$ concentration in the growth chamber.

GaN epilayers grown following this process show full width at half maximum (FWHM) of X-ray rocking curves in the 180–360 arcsec range (for asymmetric reflections). Hall electron mobilities in the 500–700 cm$^2$/Vs range at 300K, with background carrier concentration in the low $10^{16}$ cm$^{-3}$, were obtained for GaN films grown with an adequate Si/N treatment time. When measuring the PL intensity of 3D GaN layers, an increase in the intensity by a factor of about 20 is observed as compared to the 2D-growth mode. This gain in radiative efficiency is well correlated to the decrease by a factor of about 50 in the dislocation density.

EXAMPLE 2

Improvement of the Si/N Treatment According to the Present Invention

The densities of defects in material grown with a 3D mode were recently reduced down to the mid $10^7$ cm$^{-2}$ ranges as measured by atomic force microscopy by an improved Si/N treatment. Growth experiments were carried out in a 3×2" low pressure MOVPE reactor using trimethyl gallium (TMG) (308 µmole/min) as gallium source, and ammonia for providing N, a V/III ratio of 1305 and H$_2$ as carrier gas. After the Si/N treatment, a low temperature GaN nucleation layer was deposited at 525° C. The NL was then annealed at 1040° C., before proceeding growth at this temperature. The whole growth process was monitored in real time by in situ laser reflectometry, FIG. 2.

The analysis of laser reflectometry curves has been discussed in detail in paper S.Haffouz, B.Beaumont, P.Venneguès and P.Gibart, Phys. Stat. Sol., (a)176,677 (1999). In short, the nucleation layer deposited at low temperature on the Si/N treated sapphire surface experienced a 2D–3D transition as in example 1; this therefore increases the diffuse scattering of the laser beam and results in a continuous decrease of the reflectivity. Afterwards, the growth of GaN proceeds from the islands by lateral and vertical expansion until coalescence. These two stages correspond, respectively, to the profound dip in the reflectivity and to the subsequent recovering of the reflectivity level. In the improved Si/N treatment according to the present invention, the duration of the supply of SiH$_4$ and NH$_3$ lasts 360 sec. During the growth of this kind of samples, the full recovery of the reflectivity takes about 4 hours. The AFM scans in FIG. 1 show the size of the GaN islands for different Si/N treatment durations. These islands are formed after deposition of amorphous SiN from SiH$_4$/NH$_3$ on the sapphire substrate, low temperature deposition of the GaN nucleation layer and the annealing at high temperature. As expected, the size of the 3D nuclei increases with the deposition time of SiN. However, it cannot significantly be increased beyond the shown values because otherwise the recovery time would be too long for practical applications and the epitaxial relationship lost.

The TDs densities of the thick GaN layers grown onto the nucleation layers shown in FIG. 1(b) were determined by AFM scans and cathodoluminescence mapping. Both methods give comparable values around $7 \times 10^7$ cm$^{-2}$.

In Depth Characterization

1. High Resolution Transmission Electron Microscopy

Figure 3:
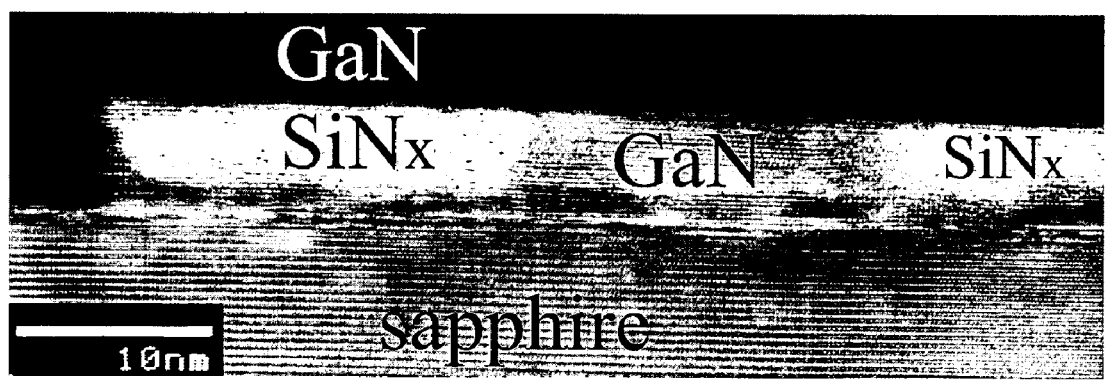
FIG. 3 shows a high resolution image of the interface in a ULD GaN/sapphire sample.

Transparent specimens for Transmission Electron Microscopy (TEM) were prepared by low angle ion milling using Ar+ bombardment at 10 kV. The energy of the impinging Ar+ ions was decreased to 3 keV after perforation and even further down to 500 eV in order to minimize ion beam damages. The specimens were investigated in a microscope operating at 300 kV. High resolution images reveal that there is an amorphous region between GaN and sapphire, most likely SiN, (EDS shows some silicon). However, the amorphous material at the interface is a discontinuous layer. Indeed, the interface SiN layer is built of grains (20 nm height and 20–40 nm long). In FIG. 3, two small amorphous inclusions inside the GaN layer at the interface are seen.

Actually the amorphous SiN layer acts as a micro-mask, thereby leading to an ELO process at a micrometer scale.

Figure 4:
FIG. 4 shows a cross-sectional bright field image of the ULD GaN/sapphire sample showing the interface region and the bending of TDs as in the ELO process.

The amorphous nature of the SiN discontinuous layer can be clearly seen. The partial SiN coverage leads to randomly distributed (in size and location) openings, thereby inducing a lateral overgrowth process. The GaN layer on these "masks" preferentially exhibits the hexagonal wurtzite symmetry and follows the usual epitaxial relationship to sapphire (30° rotation around the [0001] axis). Sometimes a cubic sequence is also observed in grains of the NL between two SiN "inclusions" (FIG. 3). However, these regions are also overgrown by hexagonal GaN. As a further proof of the occurrence of an ELO mechanism, the horizontal bending of threading dislocation occurs during this micro-ELO process as shown in FIG. 4. More precisely, FIG. 4 shows two TDs which propagate parallel to the GaN basal plane after bending.

Plan view samples of the top region of GaN were also prepared for TEM investigations. A dislocation density of $6 \times 10^7$ cm$^{-2}$ was obtained. As AFM probes larger areas, the value of $7 \times 10^7$ cm$^{-2}$ determined by AFM measurements is in good agreement with the TEM data.

2. Cathodoluminescence Microscopy

Spatially and spectrally resolved scanning cathodoluminescence microscopy (CL) has proven to be a powerful method to follow the growth process in ELO through the evolution of the optical properties.

Figure 5:
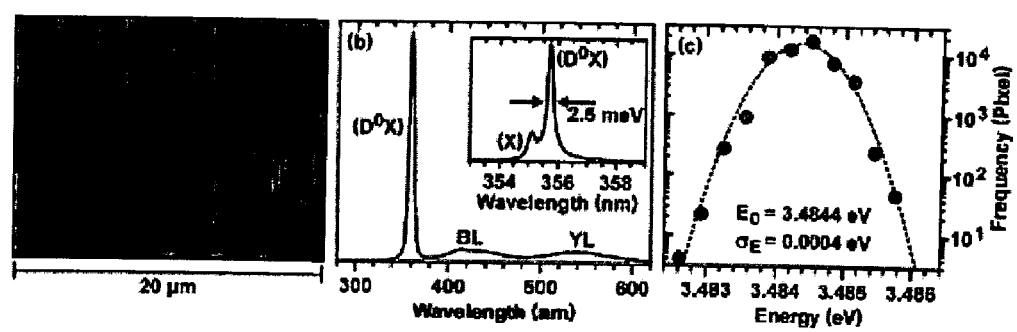
FIG. 5 shows a plan-view CL (T=6 K) of the surface of the ULD GaN/sapphire sample: (a) CL intensity image spectrally integrating from 350 nm to 370 nm, (b) CL spectra laterally integrated over an area of 20 μm×13 μm, and (c) fluctuation of the (D$^0$X) peak position derived from the histogram of the CL wavelength image of the same area.

CL mappings of the as-grown sample surface give direct access to the distribution of non-radiative defects and sub-micrometer fluctuations of the optical properties. The density of dark spots in the CL intensity image FIG. 5(a) of $5 \times 10^7$ cm$^{-2}$ perfectly corresponds to the TD density measured in AFM, taking into account the slightly lower lateral resolution of the CL signal. As already seen in cross-sectional CL, the surface emission of the sample is dominated by sharp excitonic emission, consisting of (X) and (D$^0$X). The superior lateral homogeneity is proven by the narrow distribution of the (D$^0$X) peak position in FIG. 5(c), which also accounts for the small FWHM=2.5 meV in the large-area spectrum in FIG. 5(b).

3. Photoluminescence

Figure 6:
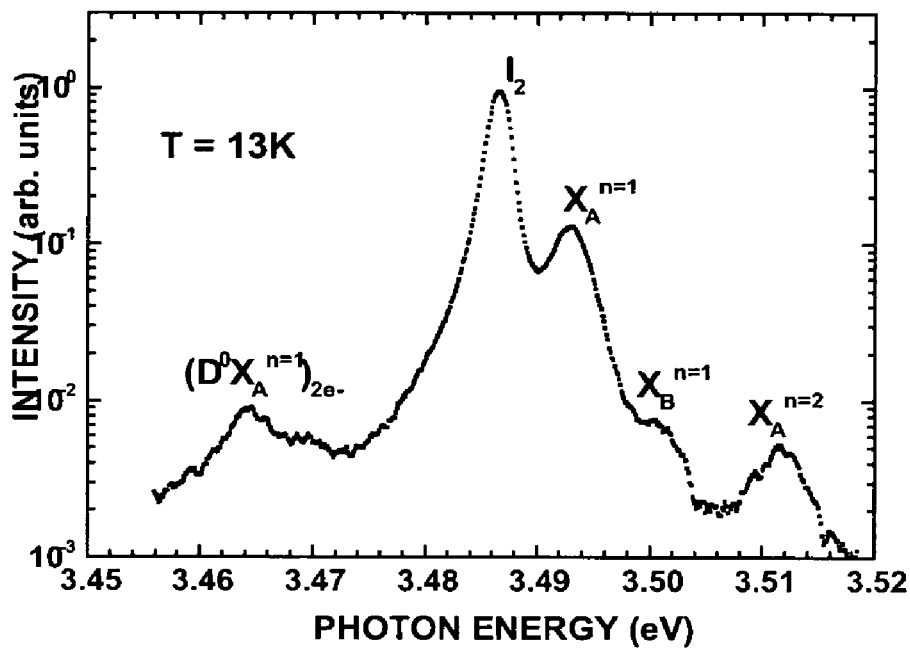
FIG. 6 shows Near band gap low temperature photomuninescence of ULD GaN/sapphire.

FIG. 6 displays the near band edge low temperature PL spectra of GaN/sapphire grown following the present technology. The PL spectrum is dominated by the so-called $I_2$ line, assigned to the donor-bound exciton (D$^0$X), lying ≈6 meV below the PL from the is-state of the free exciton with the hole in the A valence band ($X_A$). This assignment is confirmed by the reversal of intensity between these two lines, above T=40 K, due to thermal escape of excitons from the donor traps. The positions of the $X_A$ and $X_B$ lines prove that the layers are under biaxial compression [B. Gil, F. Hamdani and H. Morkoc, Phys. Rev.B 54, 7678(1996)] thus pushing the $X_c$ exciton towards much higher energies. The line at 3.512 eV is then assigned to the 2s state of the A exciton. Fluctuations of the strain are certainly the origin of the present broadening of the lines. Nevertheless, apart from the broadening, this spectrum contains many of the features that are usually observed for high-quality homoepitaxial GaN layers [K. Kornitzer, T. Ebner, M. Grehl, K. Thonke, R Sauer, C. Kirchner, V. Schwegler, M. Kamp, M. Leszczynski, I. Grzegory and S. Porowski, Phys. Stat. Sol. (b) 216, 5 (1999); K. P. Korona, Phys. Rev. B 65, 235312 (2002).].

These observations are a further proof of the high quality of the layer.

4. Time-resolved PL Results

The recombination dynamics of excess carriers in group III-nitrides is a key issue for the optimization of blue-light emitting diodes and laser diodes devices based on nitrides. Therefore, the relationships between growth parameters of GaN and optoelectronic properties are of critical importance.

Figure 7:
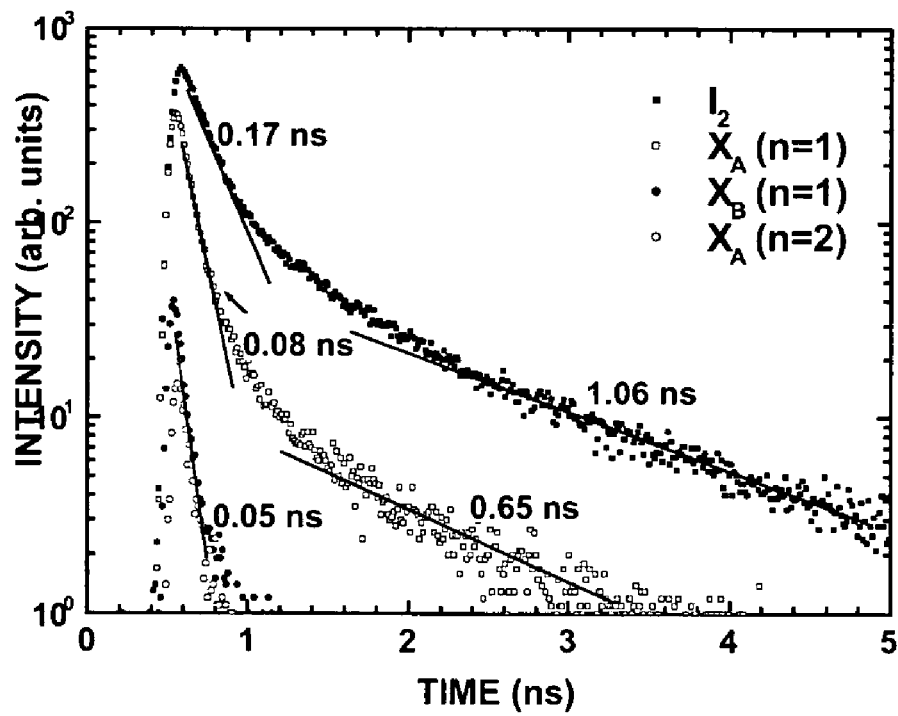
FIG. 7 shows decays of the free-excitons and I$_2$ PL intensities recorded at 13 K.
Figure 8:
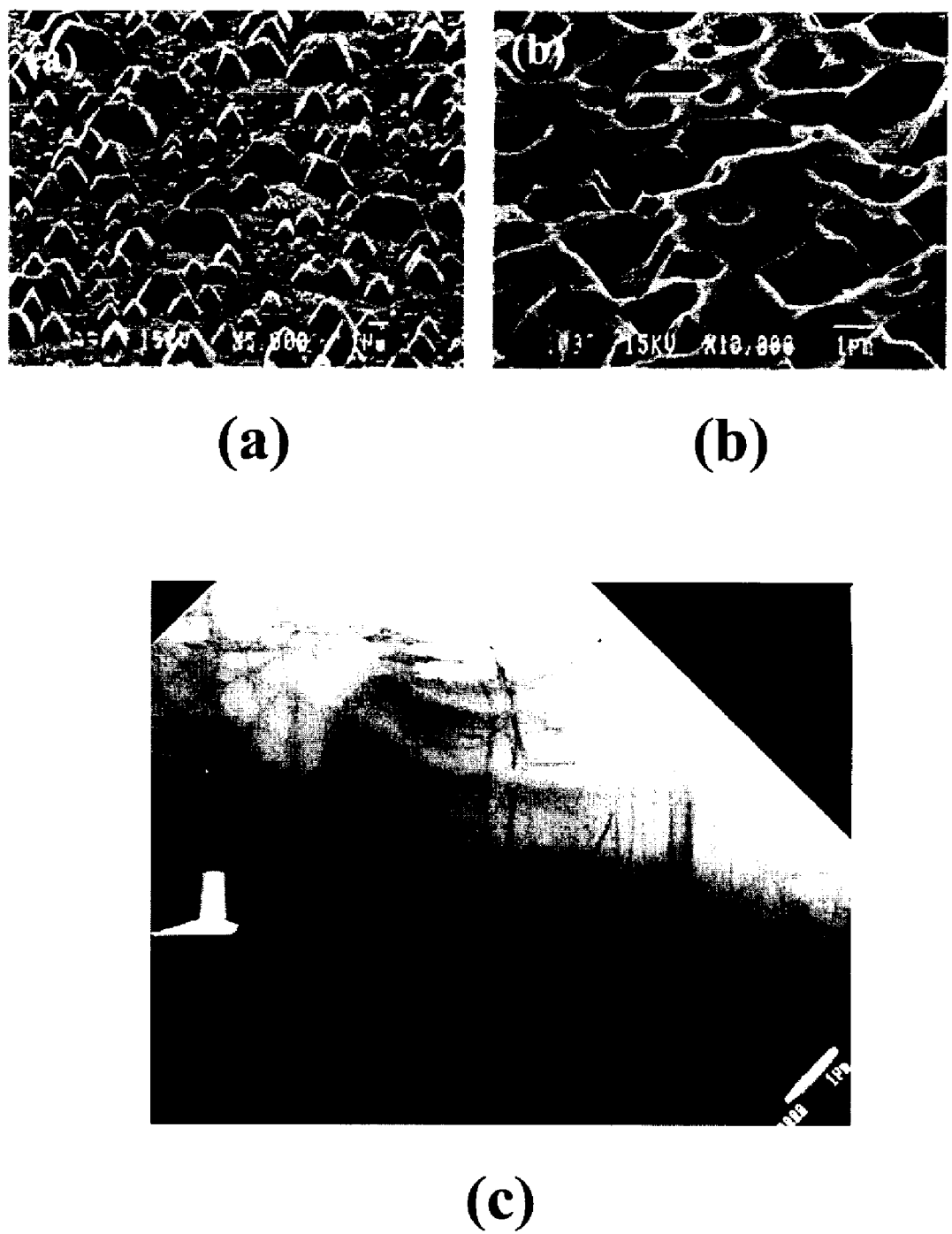
FIG. 8 shows (a) ULD GaN/sapphire after heat treatment exhibiting a coherent array of pyramids with different sizes, and (c) just before full coalescence (b) TEM of ALFAGEO GaN/sapphire obtained from stripes on different width (c) Schematic growth process and behavior of dislocations. The dislocation 1 and 2 bent three time. The progression of lateral facets is to some extend arbitrary, since it is difficult to accurately predict the growth rate of individual facet in such a structure where gas phase diffusion controls mass transfer at the growing interface.

FIG. 7 shows the PL decays recorded on an ULD layer, at T=13 K, on a time-scale of ≈5 ns. The $I_2$ line exhibits a non-exponential decay with initial decay time of ≈0.17 ns, followed by a much slower and exponential decay, with time constant of 1.06 ns. This result is totally comparable to that obtained on homoepitaxial (dislocation-free) GaN layers. Even more remarkable, the decay dynamics of the $X_A$ line starts with a rather fast exponential decay, with $\tau \approx 0.08$ ns, again comparable to the homoepitaxy, but it has clearly a long-lived component. The latter could not be observed if the decay was merely controlled by exciton trapping at non-radiative defects, as it is usually the case for lower-quality epitaxial layers. Instead, it is believed that this slow decay may correspond to re-absorption phenomena, or, rather, by the exciton-polariton nature of the recombining entity. This type of property can only be observed for high-quality samples, for which the non-radiative lifetime is much larger than the radiative lifetime. The figure also shows the fast decays recorded for the $X_B$ line and for the 2s state of $X_A$.

In the preceding paragraphs, specific embodiments are described. It will, however, be evident that various modifications and changes may be made thereto without departing from the broader spirit and scope of the claims. The specification and drawings are, accordingly, to be regarded in an illustrative rather than a restrictive sense.

What is claimed is:

1. A process for producing an epitaxial layer of gallium nitride (GaN) comprising:
    forming on a surface of a substrate, a film of a silicon nitride of between 5 to 20 monolayers, functioning as a micro-mask;
    depositing a continuous gallium nitride layer on the silicon nitride film at a temperature ranging from 400 to 600° C.;
    after depositing the gallium nitride layer, annealing the continuous gallium nitride layer at a temperature ranging from 950 to 1120° C.; and
    performing an epitaxial regrowth with continuous gallium nitride layer at the end of a spontaneous in situ formation of islands of gallium nitride.

2. A process according to claim 1, wherein the substrate is selected from the group consisting of sapphire, ZnO, 6H—SiC, 4H—SiC, 3C—SiC, LiAlO$_2$, LiGaO$_2$, MgAlO$_4$, Si, GaAs, AlN, ZrB$_2$ and GaN.

3. A process according to claim 1, wherein the silicon nitride film is a layer of the Si$_x$N$_y$ type.

4. A process according to claim 1, wherein the temperature of depositing the continuous gallium nitride layer ranges from 450 to 550° C.

5. A process according to claim 1, wherein the temperature of annealing the continuous gallium nitride layer ranges from 1050 to 1080° C.

6. A process according to claim 1, wherein the temperature of depositing the continuous gallium nitride layer ranges from 450 to 550° C. and the temperature of annealing the continuous gallium nitride layer ranges from 1050 to 1080° C.

7. A process according to claim 1, wherein the deposition of silicon nitride film is carried out with a carrier gas containing $H_2$.

8. A process according to claim 1, wherein the silicon nitride film is a layer of the $Si_xN_y$ type and wherein forming the film of silicon nitride comprises reacting ammonia and silane.

9. A process according to claim 1, wherein the temperature of depositing the continuous gallium nitride layer ranges from 450 to 550° C. and the temperature of annealing the continuous gallium nitride layer ranges from 1050 to 1080° C., wherein the deposition of silicon nitride film is carried out with a carrier gas containing $H_2$, and wherein the silicon nitride film is a layer of the $Si_xN_y$ type and wherein forming the film of silicone nitride comprises reacting ammonia and silane.

10. A process according to claim 1, wherein the epitaxial regrowth is carried out using gallium nitride doped with a dopant chosen from the group consisting in magnesium, zinc, cadmium, beryllium, calcium, silicium, oxygen, tin, germanium and carbon.

* * * * *

UNITED STATES PATENT AND TRADEMARK OFFICE
CERTIFICATE OF CORRECTION

PATENT NO.        : 7,118,929 B2
APPLICATION NO.   : 10/695724
DATED             : October 10, 2006
INVENTOR(S)       : Frayssinet et al.

It is certified that error appears in the above-identified patent and that said Letters Patent is hereby corrected as shown below:

On The Title Page
In Item [56], Other Publications, pg 2 column 2 Optimization of Si/N Treatment..., please delete line #2, "Overlays" and insert -- Overlayers --.

In Claim #1, Column 10, line 41, before "gallium", please insert -- continuous --.

Signed and Sealed this

Twentieth Day of November, 2007

JON W. DUDAS
*Director of the United States Patent and Trademark Office*